United States Patent [19]

Espe et al.

[11] Patent Number: 5,583,891
[45] Date of Patent: Dec. 10, 1996

[54] NOISE ATTENUATION CIRCUIT FOR AMPLITUDE MODULATED RADIO AND METHOD THEREFOR

[75] Inventors: Roy H. Espe, Scottsdale; Richard Potyka, Mesa, both of Ariz.

[73] Assignee: Motorola, Inc., Schaumburg, Ill.

[21] Appl. No.: 332,171

[22] Filed: Oct. 31, 1994

[51] Int. Cl.[6] ............................. H03D 1/06; H04B 7/10
[52] U.S. Cl. ................................. 375/346; 455/303
[58] Field of Search ........................ 375/351, 285, 375/346; 455/218, 222, 223, 303, 296, 311; 328/109

[56] References Cited

U.S. PATENT DOCUMENTS

| | | | |
|---|---|---|---|
| 3,188,571 | 6/1965 | Michael | 455/222 |
| 3,319,169 | 5/1967 | Axe | 375/351 |
| 3,603,884 | 9/1971 | Zaura, Jr. et al. | 455/222 |
| 3,626,294 | 12/1971 | Dancy | 455/222 |
| 3,978,412 | 8/1976 | Frerking | 455/222 |
| 3,979,679 | 9/1976 | Bush et al. | 455/218 |
| 4,124,819 | 11/1978 | Hansen . | |
| 4,244,056 | 1/1981 | Hamada et al. | 455/218 |
| 4,342,120 | 7/1982 | Settlemire et al. | 455/222 |
| 4,411,021 | 10/1983 | Yoakum | 455/222 |
| 4,416,024 | 11/1983 | Ugari et al. | 455/303 |
| 4,480,335 | 10/1984 | Kishi | 455/222 |
| 4,510,624 | 4/1985 | Thompson et al. | 455/223 |
| 4,688,265 | 8/1987 | Chemelewski et al. | 455/223 |
| 4,856,084 | 8/1989 | Richards, Jr. | 455/223 |
| 4,893,349 | 1/1990 | Eastmond et al. | 455/205 |
| 5,036,543 | 7/1991 | Ueno | 455/223 |
| 5,263,184 | 11/1993 | Nakamura et al. | 455/220 |

*Primary Examiner*—Tesfaldet Bocure
*Attorney, Agent, or Firm*—Gary W. Hoshizaki

[57] ABSTRACT

A noise attenuation circuit (43) is provided for reducing noise in an RF stage of an AM radio receiver. A RF amplifier (44) amplifies an RF signal with amplitude modulated audio information from the signal path of an AM receiver. An AM detector (46) receives the amplified RF signal and removes the audio information. A high-pass filter (47) filters out a majority of the audio information. A noise pulse couples through the hi-pass filter (47) which is detected by a pulse detector (48) when above a predetermined threshold voltage. The pulse detector (48) enables an RF timer (49) for generating a pulse of a predetermined width. The RF timer enables a RF attenuator (51) for attenuating the RF signal in the signal path of the AM receiver. The RF attenuator (51) attenuates an average noise pulse to a level approximately equal to the magnitude of an unmodulated RF signal.

19 Claims, 3 Drawing Sheets

NOISE ATTENUATION CIRCUIT FOR AMPLITUDE MODULATED RADIO AND METHOD THEREFOR

BACKGROUND OF THE INVENTION

This invention relates, in general, to noise reduction circuitry, and more particularly, to noise reduction circuits for an AM (Amplitude Modulated) radio.

An AM radio is suceptible to picking up noise from a number of sources within its environment. For example, an AM radio in an automobile may receive noise from an engine ignition system or an AM radio within a house may receive noise from a florescent light or a light dimmer. The topology of an AM radio receiver circuit exacerbates the noise problem by stretching a noise pulse thereby increasing its duration. Also, a magnitude of a noise pulse may be sufficient to overload an amplifier stage (for example, IF amplifier) in an AM radio signal path.

Noise blanking systems have been employed to reduce noise and prevent overload conditions. An example of such a noise blanking system is described, for example, in "Noise Blanking System For An AM Radio Receiver", U.S. Pat. No. 4,856,084, by Oliver L. Richards, Jr., which patent is hereby incorporated by reference. Noise blanking can be defined as blocking the signal flow of the signal path to "cut out" a noise pulse. In general, noise blanking is achieved by interrupting the signal path or shorting the signal path of an AM radio when a noise pulse is sensed.

Noise blanking systems do not completely remove noise from an AM radio receiver, in other words, some noise is still audible when heard through a speaker (although reduced in magnitude). This is due to the fact that noise blanking systems typically blank for a period of time such that the missing desired modulation in itself creates an audible noise. The predetermined period of time is chosen to blank the high magnitude portion of an average noise pulse, thus not all the noise is removed. A problem with noise blanking systems is the characteristic sound generated by the system. It is believed that the characteristic sound occurs because desired modulation along with the noise pulses are cut out from the incoming signal, thereby interrupting the signal and adding the "characteristic sound".

It would be of great benefit if a noise reduction system for an AM radio could be provided that reduces noise magnitude yet provides a more pleasing and natural characteristic sound.

BRIEF DESCRIPTION OF THE DRAWINGS

FIG. 1 is a prior art block diagram of a AM radio receiver with a noise blanking circuit;

DETAILED DESCRIPTION OF THE DRAWINGS

Figure 5:
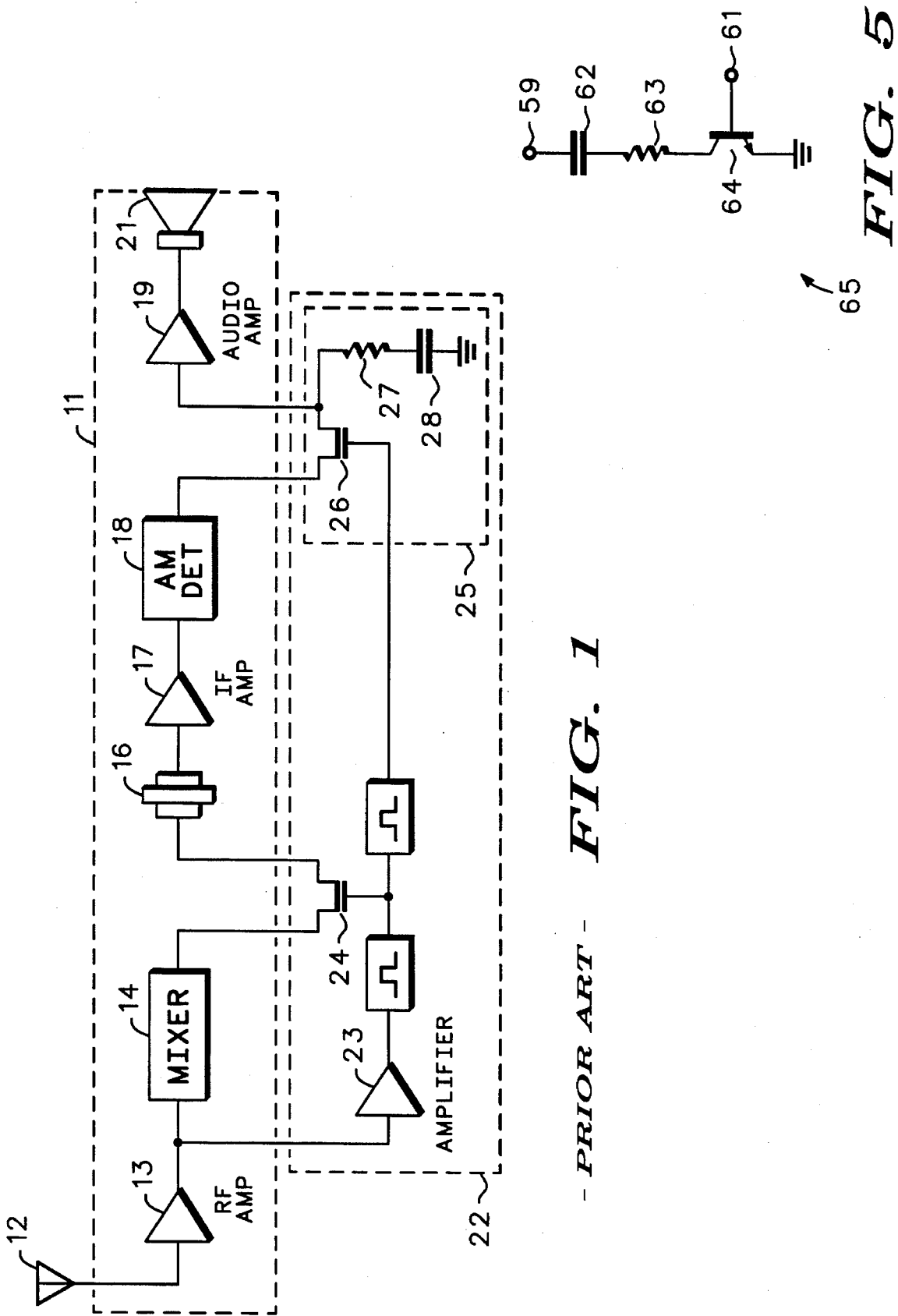
FIG. 5 is a schematic diagram of an RF attenuator circuit in accordance with the present invention.

It is well known that a noise pulse is stretched or widened by circuitry such as an RF (Radio Frequency) selectivity circuit or a filter. The selectivity circuit and filter are typical components in the signal path of an AM (Amplitude Modulated) radio receiver. The resultant widened noise signal increases the amount of noise heard from an AM radio receiver. Furthermore, a noise pulse has sufficient magnitude to saturate or overload an amplifier stage, for example, an IF (Intermediate Frequency) amplifier of a AM radio receiver. Noise blanking systems are employed to reduce noise and prevent the saturation of an amplifier stage due to a noise pulse.

Two stages of noise blanking are commonly employed in an AM radio receiver. An RF noise blanking stage cuts out a noise pulse by interrupting or shorting the incoming signal at a point in the AM radio receiver before significant widening or amplifier saturation occurs. This could be in the RF or IF section of the AM radio receiver. As the name implies, the RF noise blanking stage couples to an RF stage of an AM radio receiver. An audio noise blanking stage removes a portion of the audio information corresponding to the noise pulse. The audio noise blanking stage further reduces noise coupling through the signal path of the AM radio receiver.

An example of a noise blanking system is shown in prior art FIG. 1. An AM radio receiver 11 comprises an RF amplifier 13, mixer 14, filter 16, IF amplifier 17, AM detector 18, audio amplifier 19, and speaker 21. RF amplifier 13 is responsive to an RF signal applied to an antenna 12. Assuming no noise pulse, mixer 14 is responsive to an amplified RF signal provided by RF amplifier 13. Mixer 14 reduces the frequency of the RF signal to an IF signal (typically 455 kilohertz). Pass transistor 24 is normally enabled coupling mixer 14 to filter 16. Filter 16 is a bandpass filter centered at the IF signal frequency for removing noise and other closeby AM signals outside the bandpass range. IF amplifier 17 is responsive to the IF signal passed by filter 16 and amplifies the IF signal. AM detector 18 receives the amplified IF signal and removes the amplitude modulated signal on the IF signal which is an audio signal. Track and hold circuit 25 normally couples AM detector 18 to audio amplifier 19. The audio signal is amplified by audio amplifier 19 and output by speaker 21.

A noise blanking circuit 22 (prior art) comprises a pulse circuit 23, a pass transistor 24, and a track and hold circuit 25. Track and hold circuit 25 comprises a pass transistor 26, a resistor 27, and a capacitor 28. Pulse circuit 23 is triggered by a noise pulse received by antenna 12 above a predetermined magnitude. Pulse circuit 23 generates a pulse for disabling both pass transistor 24 and track and hold circuit 25. Pass transistor 24 decouples the incoming signal from filter 16 thereby preventing the the noise pulse from being passed through AM radio receiver 11. Similarly, track and hold circuit 25 decouples AM detector 18 from audio amplifier 19 but is delayed to account for delay through circuitry in AM radio receiver 11 signal path. Track and hold circuit 25 holds a voltage at the input of audio amplifier 19 during the duration of the interrupted signal.

Figure 2:
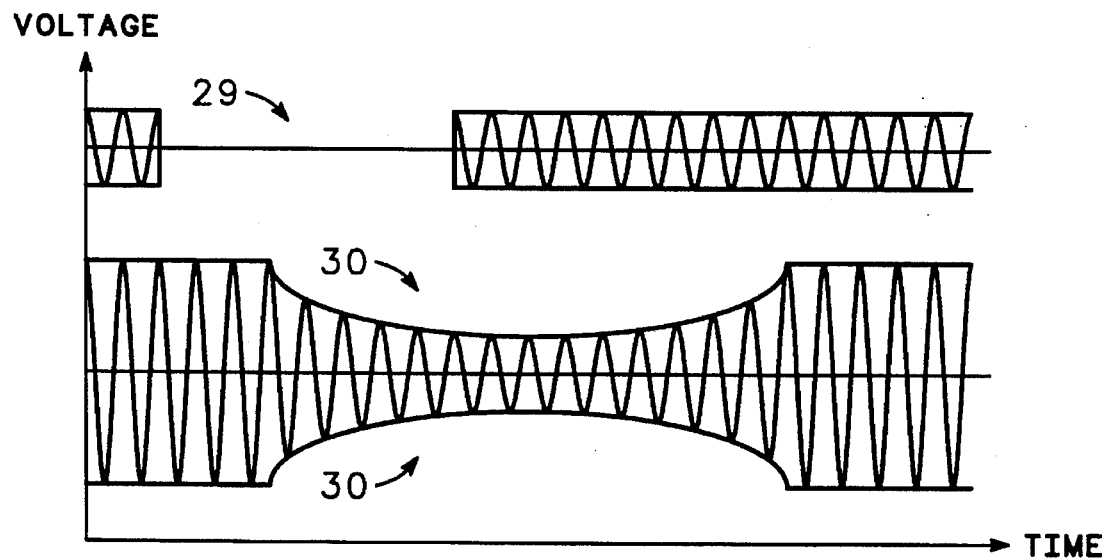
FIG. 2 is a diagram illustrating RF noise blanking corresponding to FIG. 1.

FIG. 2 is an illustration of an RF signal or carrier signal that has been blanked to remove a noise pulse. The carrier signal is not amplitude modulated to clearly show the resultant waveform due to noise blanking. Noise blanking circuit 22 removes the carrier signal as well as the noise creating a "hole" in the IF carrier as shown in an area 29 of FIG. 2. The carrier signal corresponds to what is applied to the input filter 16 of FIG. 1. Filter 16 cannot respond instantaneously to the "hole" created by noise blanking circuit 22. Filter ringing and delay will produce a decaying waveform at the output of filter 16 as shown in FIG. 2, area 30.

Although effective in reducing noise introduced by a noise pulse and preventing amplifier saturation the technique of removing a portion of the incoming RF signal has a characteristic sound audible to a human ear.

Figure 3:
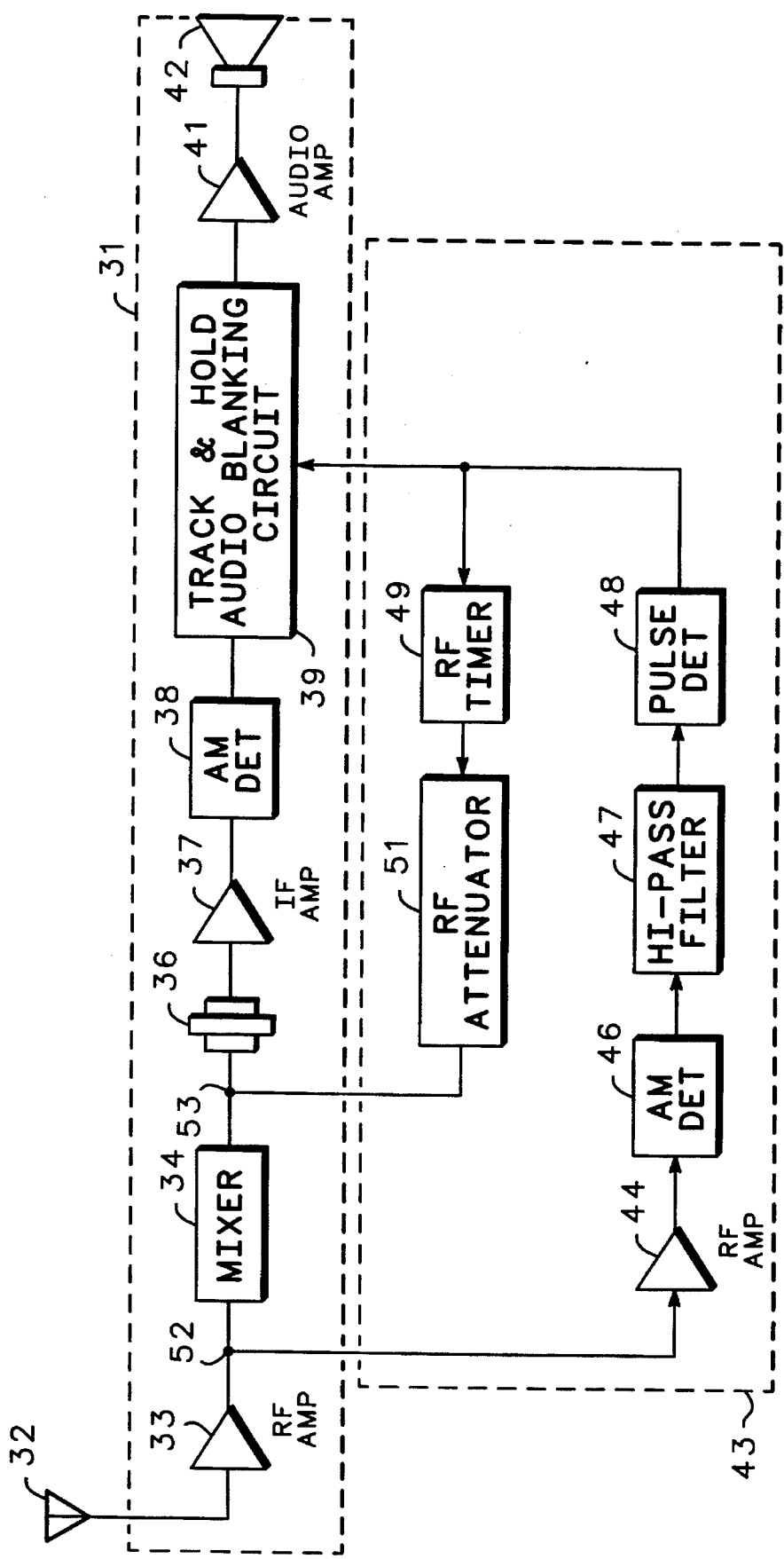
FIG. 3 is a block diagram of an AM radio receiver with noise attenuation circuitry in accordance with the present invention.

FIG. 3 is a block diagram of an AM radio receiver having a noise attenuation circuit 43 that improves the sound quality of an AM receiver 31 when receiving a noise pulse. The purpose of noise attenuation circuit 43 is to reduce noise and prevent amplifier stages of AM receiver 31 from overloading due to a noise pulse.

AM receiver 31 includes an RF amplifier 33, a mixer 34, a filter 36, an IF amplifier 37, an AM detector 38, a track and hold/audio blank circuit 39, an audio amplifier 41, and a speaker 42. RF amplifier 33 amplifies an input RF signal applied to antenna 32. RF amplifier 33 has an input coupled to antenna 32 and an output coupled to a node 52. Mixer 34 reduces the frequency of the RF signal to an IF frequency. Mixer 34 has an input coupled to node 52 and an output coupled to a node 53 for providing an IF signal. Although not shown, an RF selectivity stage is typically used to select a portion of the AM band (radio station) and couples between RF amplifier 33 and mixer 34.

Filter 36 is a bandpass filter for passing an IF signal generated by mixer 34. Filter 36 has an input coupled to node 53 and an output. IF amplifier 37 amplifies the IF signal and has an input coupled to the output of filter 36 and an output. AM detector 38 detects an amplitude modulated signal from the IF signal. AM detector 38 has an input coupled to the output of IF amplifier 37 and an output for providing an audio signal. Track and hold/audio blank circuit 39 blanks an audio signal corresponding to RF blanking of a noise pulse. Track and hold/audio blank circuit 39 has an input coupled to the output of AM detector 38, a control input, and an output. Audio amplifer 41 amplifies the audio signal and has an input coupled to the output of track and hold/audio blank circuit 39 and an output coupled to speaker 42.

Noise attenuation circuit 43 includes an RF amplifier 44, an AM detector 46, a hi-pass filter 47, a pulse detector 48, a RF timer 49, and a RF attenuator 51. Noise reduction circuitry 43 attenuates a noise pulse instead of cutting out or interrupting the noise pulse like a typical noise blanking system. RF amplifier 44 has an input coupled to node 52 and an output. AM detector 46 has an input coupled to the output of RF amplifier 44 and an output. Hi-pass filter 47 has an input coupled to the output of AM detector 46 and an output. Pulse detector 48 has an input coupled to the output of hi-pass filter 47 and and an output coupled to the control input of track and hold/audio blank circuit 39. RF timer 49 has an input coupled to the output of pulse detector 48 and an output. RF attenuator 51 has an input coupled to the output of RF timer 49 and an output coupled to node 53.

In general, information such as speech or music is provided by a radio station for reception by an AM radio receiver. The audio information is amplitude modulated on an RF signal. The RF signal is used as a carrier signal to transmit the audio information over significant distances. RF amplifier 44 of noise attenuation circuit 43 amplifies an RF signal coupled to antenna 32, in particular it amplifies the RF signal from node 52. It should be noted that a noise pulse can have a magnitude significantly larger than a RF signal with amplitude modulated information. AM detector 46 removes the amplitude modulated audio information from the RF signal or carrier signal. Noise from a noise pulse is also detected by AM detector 46 and couples through with the audio information.

Hi-pass filter 47 removes the audio information and passes noise from a noise pulse. In the preferred embodiment, hi-pass filter 47 filters out frequencies below 10 kilohertz which removes most of the audio information. Hi-pass filter 47 also prevents a large amplitude audio signal from tripping pulse detector 48. For example, Pulse detector 48 senses a remaining signal passed by hi-pass filter 47. Pulse detector 48 senses a signal greater than a predetermined threshold voltage. The predetermined threshold voltage of pulse detector 48 is chosen to trip for most noise pulses common to an environment of an AM radio receiver yet not trip for typical amplitude modulated signals. Pulse detector 48 provides a signal to RF timer 49 for generating a pulse to attenuate the RF signal for a period corresponding to the noise pulse. In the preferred embodiment, the pulse provided by RF timer 49 is a predetermined width. RF attenuator 51 is enabled by the pulse provided by RF timer 49 and reduces the magnitude of the RF signal at node 53.

In the preferred embodiment, RF attenuator 51 attenuates the RF signal by a fixed amount. The fixed amount is chosen to attenuate an average noise pulse to a magnitude approximately equal to that of an unmodulated RF carrier signal. It has been found that reducing the magnitude of a noise impulse produces a more pleasing aural effect than RF blanking systems that totally remove a noise pulse and RF signal. An alternative to a fixed attenuation is an active approach wherein the magnitude of the noise pulse is sensed and the level of attenuation varied to minimize aural effects due to noise.

Audio blanking is used in conjunction with the RF attenuation described hereinabove. Track and hold/audio blank circuit 39 is activated by pulse detector 48 when RF timer 49 is enabled. An audio blank circuit of track and hold/audio blank circuit 39 provides delay to synchronize the blanking function with the noise pulse (circuitry in the AM receiver signal path adds delay) and generates a pulse of a predetermined time period for enabling track and hold circuitry. The track and hold/audio blank circuit 39 stores the last level prior to being enabled by pulse detector 48 and holds the input of audio amplifier 41 at this level while audio blanking occurs. It also decouples the output of AM detector 38 from audio amplifier 41 during audio blanking. Noise is still audible from speaker 42 even though a portion of the audio is blanked during the RF attenuation. The RF attenuated noise has been found to be less annoying and more natural sounding than RF blanking where the noise is actually cut out of the RF signal.

Figure 4:
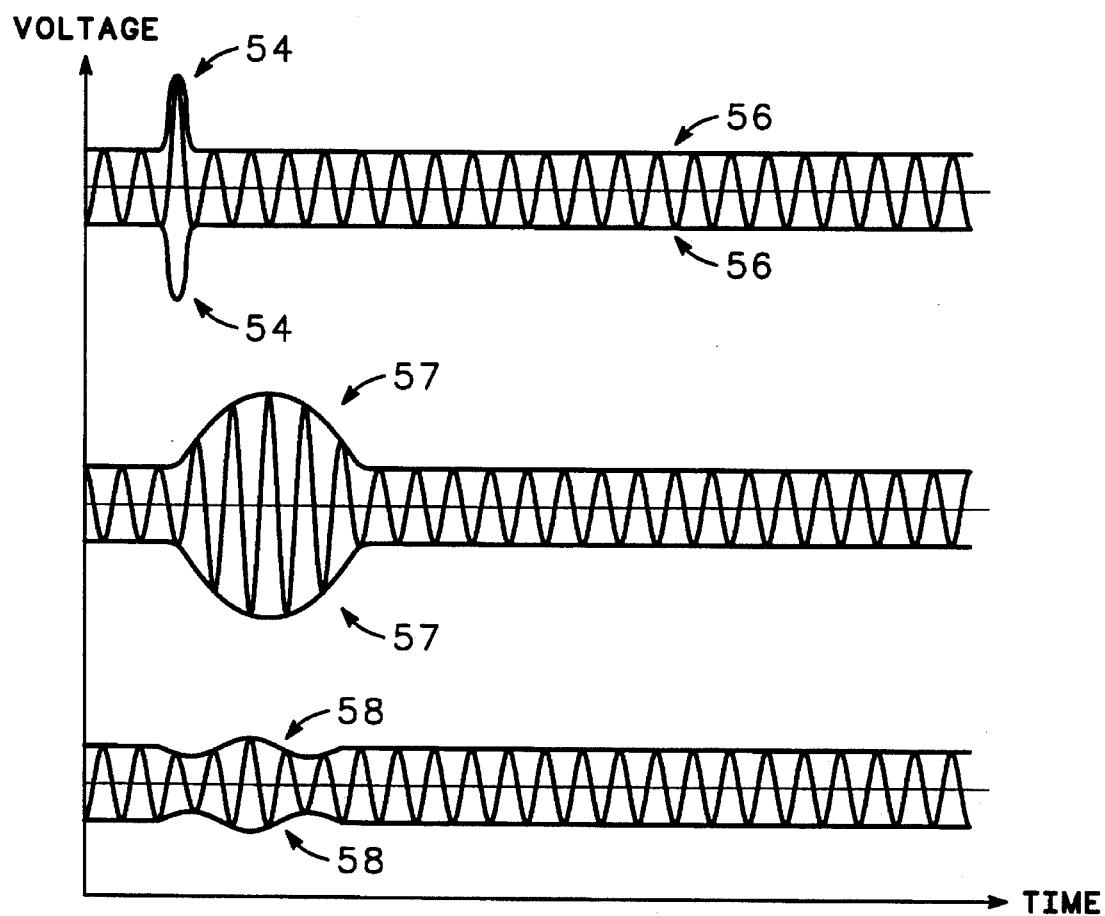
FIG. 4 is a diagram illustrating noise attenuation corresponding to the block diagram of FIG. 3.

FIG. 4 is a diagram illustrating the attenuation of a noise pulse 54 corresponding to the block diagram of FIG. 3. A noise pulse 54 is received by antenna 32 of FIG. 3. No amplitude modulation is shown on RF signal (carrier signal) 56 to clearly illustrate noise attenuation. Noise pulse 54 has a magnitude greater than the RF signal and any amplitude modulated signal (not shown) placed on the carrier signal. Noise pulse 54 is stretched by circuitry in the signal path of an AM receiver. For example, RF selectivity circuits (not shown) will stretch or widen a noise pulse. A stretched noise pulse 57 corresponds to a signal at node 52 of FIG. 3. The stretched noise pulse is sensed thereby enabling noise attenuation circuit 43 of FIG. 3. An attenuated noise pulse 58 is attenuated by RF attenuator 51 of FIG. 3 at node 53. In the preferred embodiment, the average magnitude of attenuated noise pulse 58 is approximately the magnitude of the unmodulated RF signal.

FIG. 5 is a schematic diagram of an RF attenuator 65 corresponding to RF attenuator 51 of FIG. 3. RF attenuator 65 includes an input 61 and an output 59. RF attenuator 65 comprises capacitor 62, resistor 63, and transistor 64. Capacitor 62 has a first terminal coupled to output 59 and a second terminal. Resistor 63 has a first terminal coupled to the second terminal of capacitor 62 and a second terminal. In the preferred embodiment, transistor 64 is a bipolar transistor having a base coupled to input 61, a collector coupled to the second terminal of resistor 63, and an emitter coupled to ground. A MOSFET could also be used as a shunt element in place of the bipolar transistor.

A signal applied to input 61 forward biases the base-emitter junction of transistor 64. Capacitor 62 blocks a DC voltage and provides AC coupling. In the preferred embodiment, resistor 63 loads the output of mixer 34 of FIG. 3 for attenuating a noise pulse. The value of resistor 63 determines the amount of attenuation which is chosen to attenuate an average noise pulse to a level approximately equal to the magnitude of an unmodulated RF signal (carrier signal).

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A noise attenuation circuit for reducing noise in an AM radio receiver, the noise attenuation circuit comprising:

means for detecting a noise pulse in an RF signal received by the AM radio receiver; and an RF attenuator for attenuating said RF signal in a signal path of the AM radio receiver, said RF attenuator being enabled when said noise pulse is detected and said RF attenuator reducing a magnitude of said noise pulse.

2. The noise attenuation circuit as recite in claim 1 wherein said RF attenuator attenuates said noise pulse to a level approximately equal to a magnitude of an unmodulated RF signal.

3. The noise attenuation circuit as recited in claim 1 further including an RF amplifier responsive to said RF signal for providing an amplified RF signal.

4. The noise attenuation circuit as recited in claim 3 further including an AM detector responsive to said amplified RF signal for detecting an audio signal amplitude modulated on said amplified RF signal.

5. The noise attenuation circuit as recited in claim 4 further including a high-pass filter responsive to said audio signal provided by said AM detector, said high-pass filter for filtering out said audio signal and passing noise from said noise pulse.

6. The noise attenuation circuit as recited in claim 5 further including a pulse detector responsive to said noise passed by said high-pass filter, said pulse detector providing a pulse detect signal when said noise is greater than a predetermined threshold voltage.

7. The noise attenuation circuit as recited in claim 6 further including an RF timer circuit responsive to said pulse detect signal and providing a pulse of a predetermined time period.

8. The noise attenuation circuit as recited in claim 7 wherein said predetermined time period is approximately equal to an average period of said noise pulse.

9. The noise attenuation circuit as recited in claim 8 wherein said RF attenuator has an input for receiving said pulse from said RF timer circuit and an output for loading said signal path of said AM radio receiver for attenuating said noise pulse.

10. The noise attenuation circuit as recited in claim 9 wherein said RF attenuator comprises a capacitor having a first terminal coupled to said output of said RF attenuator and a second terminal;

a resistor having a first terminal coupled to said second terminal of said capacitor and a second terminal; and a transistor having a first electrode coupled to said second terminal of said resistor, a control electrode coupled to said input of said RF attenuator, and a second electrode coupled for receiving a power supply voltage.

11. A method for reducing noise in an AM radio receiver, the radio receiver receiving an RF signal, the method comprising the steps of:

detecting a noise pulse from the received RF signal; and attenuating the RF signal during said noise pulse to reduce noise output by the AM radio receiver.

12. The method for reducing noise in an AM radio receiver as recited in claim 11 wherein said step of attenuating the RF signal and the noise pulse further includes a step of reducing the magnitude of the RF signal and the noise pulse to a level approximately equal to an average unmodulated RF signal carrier normally received by the AM radio receiver.

13. The method for reducing noise in an AM radio receiver as recited in claim 11 wherein said step of detecting the noise pulse further includes the steps of:

detecting an AM signal on the RF signal;

filtering said AM signal of audio information to sense noise magnitude; and detecting when said noise is greater than a predetermined threshold.

14. An AM radio receiver comprising:

an RF amplifier having an input and an output;

a mixer having an input coupled to said output of said RF amplifier and an output;

a filter having an input coupled to said output of said mixer and an output;

an IF amplifier having an input coupled to said output of said filter and an output;

an AM detector having an input coupled to said output of said IF amplifier and an output;

an audio amplifier having an input coupled to said output of said AM detector and an output; and a noise attenuation circuit for attenuating a noise pulse received by the AM radio receiver, said noise attenuation circuit having an input coupled to said output of said RF amplifier and an output coupled to said output of said mixer.

15. The AM radio receiver as recited in claim 14 wherein said noise attenuation circuit attenuates said noise pulse to a level of approximately a magnitude of an unmodulated RF signal normally received by the AM radio receiver.

16. The AM radio receiver as recited in claim 14 wherein said noise attenuation circuit includes:

a RF amplifier having an input coupled to said input of said noise attenuation circuit and an output;

an AM detector having an input coupled to said output RF amplifier of said noise attenuation circuit and an output;

a hi-pass filter having an input coupled to said output of said AM detector and an output;

a pulse detector having an input coupled to said output of said hi-pass filter and an output;

a RF timer for providing a pulse, said RF timer having an input coupled to said output of said pulse detector and an output; and a RF attenuator having an input coupled to said output of said RF timer and an output coupled to said output of said noise attenuation circuit.

17. The AM radio receiver as recited in claim 16 wherein said RF attenuator comprises:

a capacitor having a first terminal coupled to said output of said RF attenuator and a second terminal;

a resistor having a first terminal coupled to said second terminal of said capacitor and a second terminal; and a transistor having a first electrode coupled to said second terminal of said resistor, a control electrode coupled to said input of said RF attenuator, and a second electrode coupled for receiving a power supply voltage.

18. The AM radio receiver as recited in claim 16 further including a track and hold/audio blank circuit for blanking an audio signal, said track and hold/audio blank circuit having an input coupled to said output of said AM detector of the AM radio receiver, a control input coupled to said output of said pulse detector of said noise attenuation circuit, and an output coupled to said input of said audio amplifier.

19. The AM radio receiver as recited in claim 16 wherein the AM radio receiver receives a noise pulse with an RF signal, wherein said hi-pass filter removes audio information detected from said RF signal, wherein noise from said noise pulse couples through said hi-pass filter, and wherein said pulse detector provides a signal when noise from said hi-pass filter exceeds a predetermined threshold.

\* \* \* \* \*